US011327373B2

(12) United States Patent
Abe et al.

(10) Patent No.: US 11,327,373 B2
(45) Date of Patent: May 10, 2022

(54) DISPLAY DEVICE AND WIRING SUBSTRATE

(71) Applicant: Japan Display Inc., Tokyo (JP)

(72) Inventors: Hideaki Abe, Minato-ku (JP); Yasuhito Aruga, Minato-ku (JP); Hiroyuki Onodera, Minato-ku (JP); Hiroki Kato, Minato-ku (JP); Yasushi Nakano, Minato-ku (JP); Hitoshi Kawaguchi, Minato-ku (JP); Keisuke Asada, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/142,458

(22) Filed: Jan. 6, 2021

(65) Prior Publication Data
US 2021/0157192 A1    May 27, 2021

Related U.S. Application Data

(63) Continuation of application No. 16/269,906, filed on Feb. 7, 2019, now Pat. No. 10,921,657.

(30) Foreign Application Priority Data

Feb. 9, 2018   (JP) .............................. JP2018-022381

(51) Int. Cl.
*H05K 1/11*   (2006.01)
*G02F 1/1345*   (2006.01)
(Continued)

(52) U.S. Cl.
CPC ...... *G02F 1/13452* (2013.01); *G02F 1/13458* (2013.01); *H05K 1/0266* (2013.01);
(Continued)

(58) Field of Classification Search
CPC ...................... H05K 1/00; H05K 1/02; H05K 1/0266–0269; H05K 1/11; H05K 1/14;
(Continued)

(56) References Cited

U.S. PATENT DOCUMENTS

| 5,951,304 A | 9/1999 | Wildes |
| 7,148,427 B2 | 12/2006 | Aruga |

(Continued)

FOREIGN PATENT DOCUMENTS

| JP | 2003-218492 A | 7/2003 |
| JP | 2008-10829 A | 1/2008 |
| JP | 2015-204458 A | 11/2015 |

OTHER PUBLICATIONS

Office Action dated Oct. 5, 2021 in corresponding Japanese Patent Application No. 2018-022381 (with English Translation), 7 pages.
(Continued)

*Primary Examiner* — Tuan T Dinh
(74) *Attorney, Agent, or Firm* — Oblon, McClelland, Maier & Neustadt, L.L.P.

(57) ABSTRACT

A display device includes: a display panel including panel terminals; and a wiring substrate including first substrate terminals coupled to the panel terminals. The panel terminals include panel terminals arranged in a first region and panel terminals arranged in second regions sandwiching the first region. The first substrate terminals include first substrate terminals arranged in a third region and first substrate terminals arranged in fourth regions sandwiching the third region. A gap between panel terminals is substantially constant in the first and second regions. A first width of the panel terminals in the first region is different from a second width of the panel terminals is the second regions. A width of the first substrate terminals is substantially constant in the third and fourth regions. A first gap between first substrate ter- (Continued)

minals in the third region is different from a second gap between first substrate terminals in the fourth regions.

9 Claims, 10 Drawing Sheets

(51) Int. Cl.
  *H05K 3/36* (2006.01)
  *H05K 1/02* (2006.01)
  *H05K 1/14* (2006.01)
  *H05K 1/18* (2006.01)
  *H01L 27/12* (2006.01)
  *G02F 1/1368* (2006.01)
  *G02F 1/1333* (2006.01)

(52) U.S. Cl.
  CPC ............... *H05K 1/11* (2013.01); *H05K 1/144* (2013.01); *H05K 1/181* (2013.01); *H05K 3/368* (2013.01); *G02F 1/1368* (2013.01); *G02F 1/133354* (2021.01); *G02F 2202/28* (2013.01); *H01L 27/1214* (2013.01); *H05K 2201/041* (2013.01); *H05K 2201/049* (2013.01); *H05K 2201/09936* (2013.01); *H05K 2201/10136* (2013.01); *H05K 2203/166* (2013.01)

(58) Field of Classification Search
  CPC .. H05K 1/18; H05K 1/181–189; H05K 3/361; G02F 1/13; G02F 1/1333; G02F 1/1345; H01L 23/48; H01L 23/528; H01L 23/5386

USPC ................ 361/749, 760–767, 775–778, 803; 174/254–262; 349/149–151
  See application file for complete search history.

(56) References Cited

U.S. PATENT DOCUMENTS

| | | |
|---|---|---|
| 7,419,380 B2 | 9/2008 | Yamada |
| 10,242,605 B2 | 3/2019 | Chen |
| 10,451,932 B2* | 10/2019 | Chen ................... H01L 23/4985 |
| 10,665,151 B2 | 5/2020 | Zhang |
| 2003/0022558 A1 | 1/2003 | Imaoka |
| 2006/0049494 A1 | 3/2006 | Urushido |
| 2007/0195763 A1 | 8/2007 | Onodera |
| 2007/0275578 A1 | 11/2007 | Yamada |
| 2008/0030666 A1* | 2/2008 | Abe ..................... G02F 1/13452 349/150 |
| 2014/0321088 A1 | 10/2014 | Bae |
| 2015/0103500 A1 | 4/2015 | Bae |
| 2015/0366049 A1 | 12/2015 | Lee |
| 2019/0067406 A1* | 2/2019 | Lee ....................... H01L 23/544 |

OTHER PUBLICATIONS

Office Action dated Jan. 18, 2022, in Japanese Patent Application No. 2018-022381, w/English-language Translation.

* cited by examiner

DISPLAY DEVICE AND WIRING SUBSTRATE

CROSS-REFERENCE TO RELATED APPLICATIONS

This application is a continuation of U.S. application Ser. No. 16/269,906, filed Feb. 7, 2019, and claims priority from Japanese Application No. 2018-022381, filed on Feb. 9, 2018, the contents each of which are incorporated by reference herein in its entirety.

BACKGROUND

1. Technical Field

The present disclosure relates to a display device and a wiring substrate.

2. Description of the Related Art

There has been an increasing demand for display devices for mobile electronic apparatuses, for example. Various structures of the display devices are known, including a structure having a display panel and a wiring substrate mounted on the display panel. Also known is a structure in which a drive circuit that drives the display panel is mounted on the wiring substrate. In this structure, drive signals output from the drive circuit are supplied to the display panel via wiring on the wiring substrate (e.g., Japanese Patent Application Laid-open Publication No. 2008-10829).

The quality of mounting a wiring substrate on a display panel needs to be improved.

SUMMARY

According to an aspect, a display device includes: a display panel including a plurality of panel terminals arranged in a first direction; and a wiring substrate including a plurality of first substrate terminals arranged in the first direction and coupled to the panel terminals. The panel terminals include panel terminals arranged in a first region and panel terminals arranged in second regions sandwiching the first region. The first substrate terminals include first substrate terminals arranged in a third region and first substrate terminals arranged in fourth regions sandwiching the third region. A gap between adjacent panel terminals of the panel terminals is substantially constant in the first region and the second regions. A first width of the panel terminals in the first region is different from a second width of the panel terminals in the second regions. A width of the first substrate terminals is substantially constant in the third region and the fourth regions. A first gap between adjacent first substrate terminals of the first substrate terminals in the third region is different from a second gap between adjacent first substrate terminals of the first substrate terminals in the fourth regions.

According to another aspect, a display device includes: a display panel including a plurality of panel terminals arranged in a first direction; a first wiring substrate including a plurality of first substrate terminals arranged in the first direction and coupled to the panel terminals and a plurality of second substrate terminals arranged in the first direction on a side opposite to a side on which the first substrate terminals are provided; a second wiring substrate coupled to the second substrate terminals; and an IC chip mounted between the first substrate terminals and the second substrate terminals in a second direction orthogonal to the first direction on the first wiring substrate and configured to drive the display panel. The IC chip is coupled to the first substrate terminals and the second substrate terminals. The panel terminals, the first substrate terminals, and the second substrate terminals each have a long side and a short side. The long side of each of the panel terminals and the first substrate terminals has an inclination with respect to the second direction. The inclination of the panel terminals increases from a center position of the display panel in the first direction to an edge of the display panel and with distance from the center position in the first direction. The inclination of the first substrate terminals increases from a center position of the first wiring substrate in the first direction to an edge of the first wiring substrate and with distance from the center position in the first direction. The long sides of the second substrate terminals are parallel to the second direction. A gap between adjacent panel terminals of the panel terminals is substantially the same from the center position to the edge of the display panel, and a gap between adjacent first substrate terminals of the first substrate terminals increases from the center position to the edge of the first wiring substrate.

DETAILED DESCRIPTION

Figure 1:
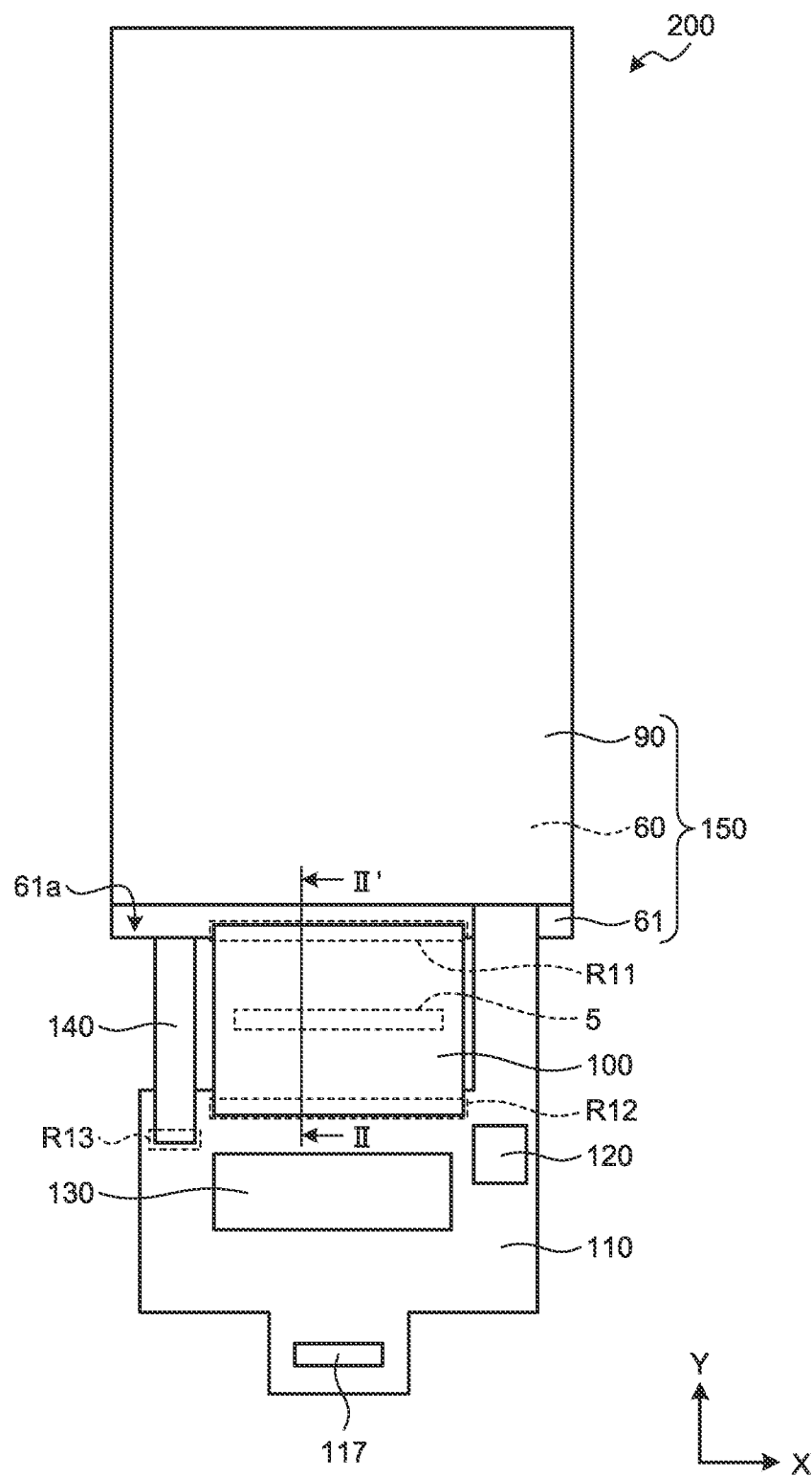
FIG. 1 is a plan view of an exemplary configuration of a display device according to an embodiment.

Exemplary aspects (embodiments) to embody the present invention are described below in greater detail with reference to the accompanying drawings. The contents described in the embodiments are not intended to limit the present invention. Components described below include components easily conceivable by those skilled in the art and components substantially identical therewith. Furthermore, the components described below may be appropriately combined. What is disclosed herein is given as an example only, and appropriate changes made without departing from the spirit of the invention and easily conceivable by those skilled in the art naturally fall within the scope of the invention. To simplify the explanation, the drawings may possibly illustrate the width, the thickness, the shape, and other elements of each unit more schematically than the actual aspect. These elements, however, are given as an example only and are not intended to limit interpretation of the present invention. In the present specification and the figures, components similar to those previously described with reference to previous figures are denoted by the same reference numerals, and detailed explanation thereof may be appropriately omitted.

In this disclosure, when an element is described as being "on" another element, the element can be directly on the other element, or there can be one or more elements between the element and the outer element.

Figure 2:
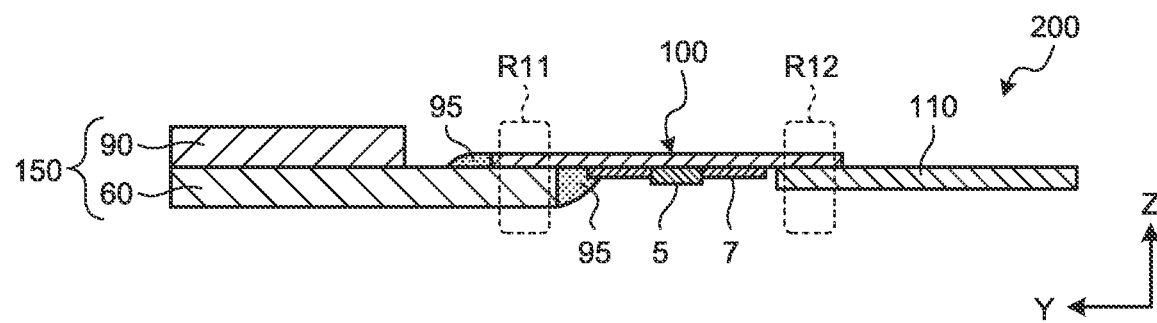
FIG. 2 is a sectional view taken along line II-II' of FIG. 1.
Figure 3:
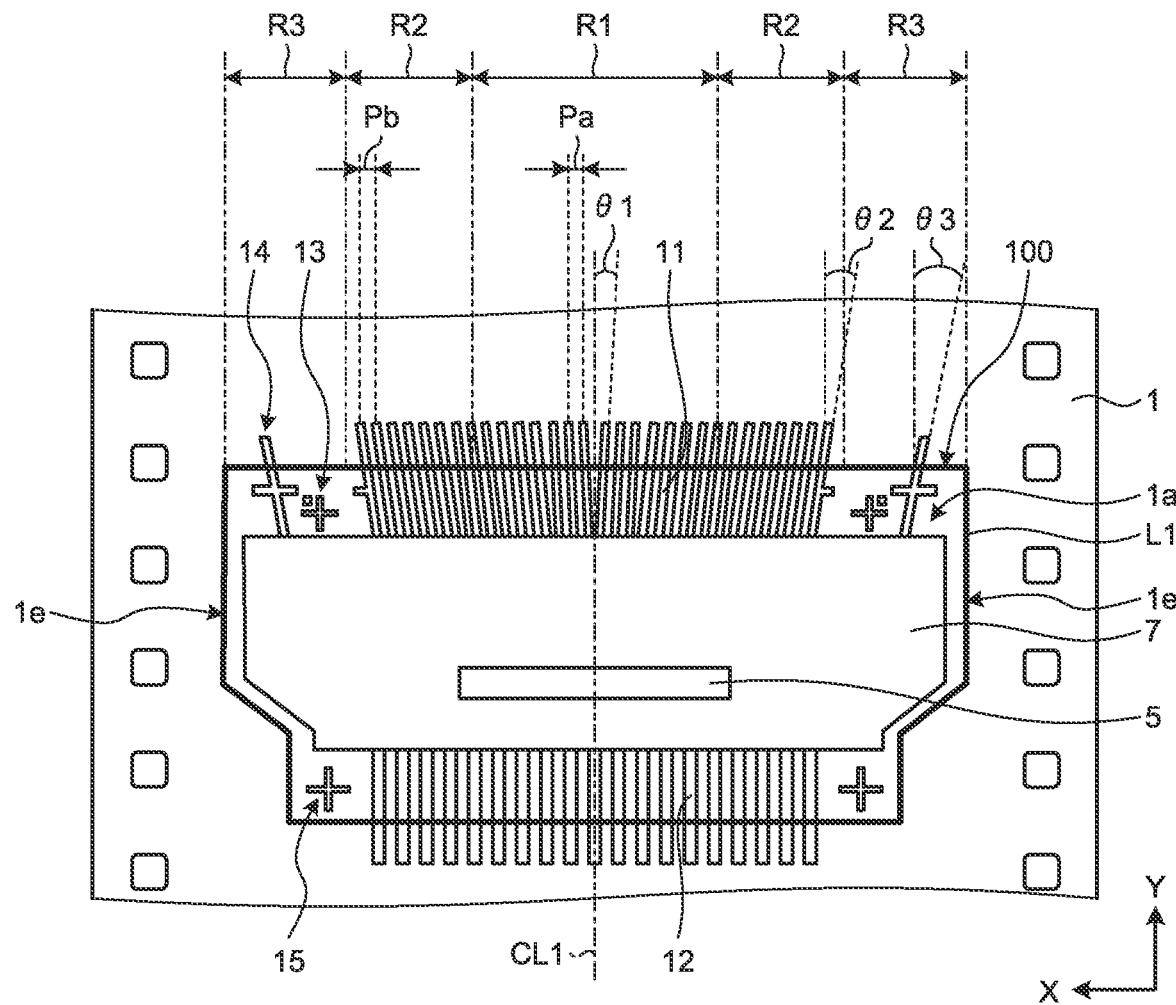
FIG. 3 is a plan view of an exemplary configuration of a first wiring substrate according to the embodiment.
Figure 4:
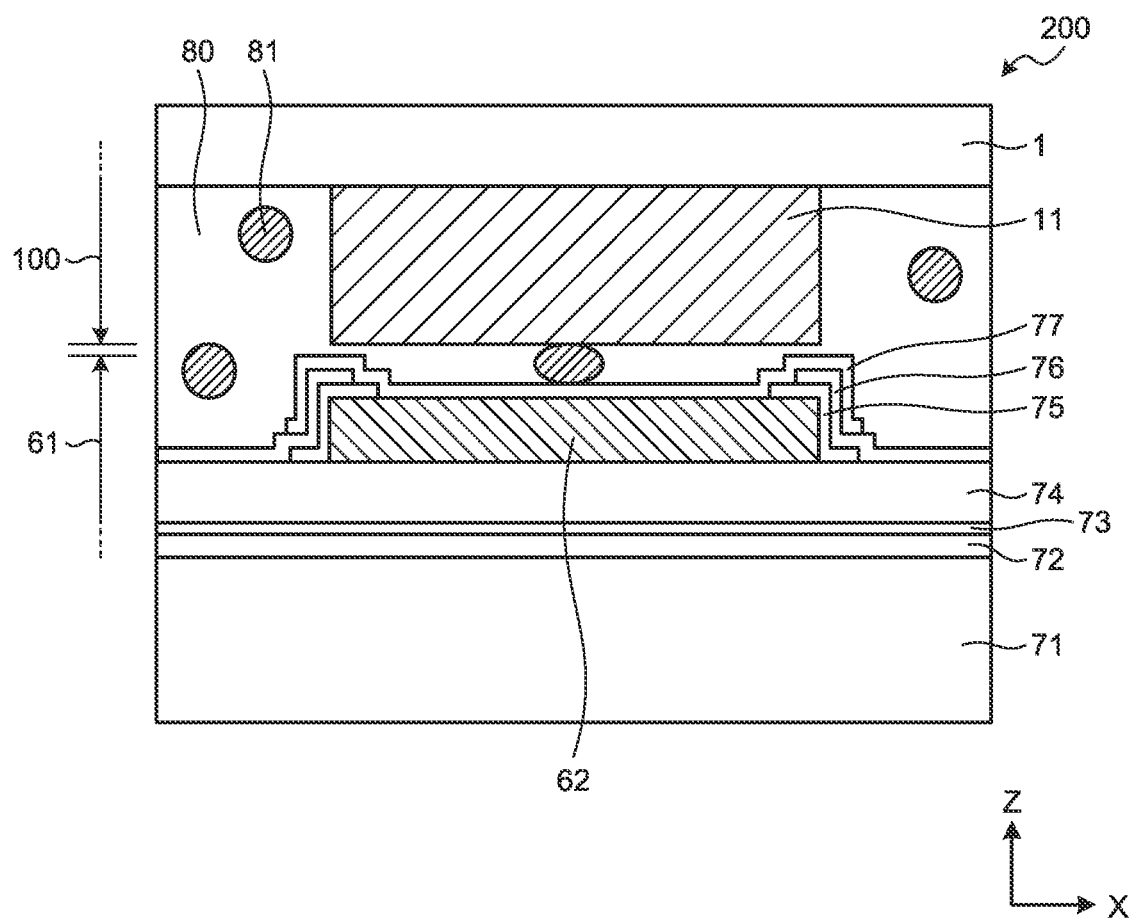
FIG. 4 is a sectional view of an exemplary structure of bonding between the first wiring substrate and a TFT substrate according to the embodiment.

FIG. 1 is a plan view of an exemplary configuration of a display device according to an embodiment. FIG. 2 is a sectional view taken along line II-II' of FIG. 1. FIG. 3 is a plan view of an exemplary configuration of a first wiring substrate according to the embodiment. FIG. 4 is a sectional view of an exemplary structure of bonding between the first wiring substrate and a TFT substrate according to the embodiment. In the following description, an XYZ orthogonal coordinate system is used, and the positional relation between members is described with reference to the XYZ orthogonal coordinate system. The X-axis direction is a first direction, the Y-axis direction is a second direction orthogonal to the first direction, and the Z-axis direction is a direction orthogonal to the X-axis direction and the Y-axis direction (that is, a direction perpendicular to the X-Y plane).

As illustrated in FIGS. 1 and 2, a display device 200 includes a display panel 150, a first wiring substrate 100, a second wiring substrate 110, a third wiring substrate 140, and a resin layer 95. The first wiring substrate 100 is electrically coupled to the display panel 150. While the display panel 150 is provided with a lighting device such as a backlight, a touch panel, and other auxiliary devices as needed besides the first wiring substrate 100, the second wiring substrate 110, and the third wiring substrate 140, FIG. 1 does not illustrate the other devices.

The display panel 150 is a liquid crystal panel, for example. The display panel 150 includes a TFT substrate 60, a counter substrate 90, a sealing member (not illustrated), and a liquid crystal layer (not illustrated). The counter substrate 90 is disposed facing the TFT substrate 60. The sealing member bonds the TFT substrate 60 and the counter substrate 90. The liquid crystal layer is sealed between the TFT substrate 60 and the counter substrate 90. A region of the TFT substrate 60 facing the counter substrate 90, for example, is provided with a plurality of lines (not illustrated) extending in the X-axis direction and the Y-axis direction. On the TFT substrate 60, a portion at which the lines intersect corresponds to the smallest unit of display, that is, a pixel. A plurality of pixels are arrayed in a matrix (row-column configuration), thereby forming the entire display region. A color filter, which is not illustrated, is disposed between the liquid crystal layer and the counter substrate 90, for example. The color filter may be printed on the surface of the counter substrate 90 facing the TFT substrate 60.

The display panel 150 according to the present embodiment is not limited to a liquid crystal panel. The display panel 150 may be an organic electroluminescence (EL) panel or an electrophoretic display, for example.

Figure 5:
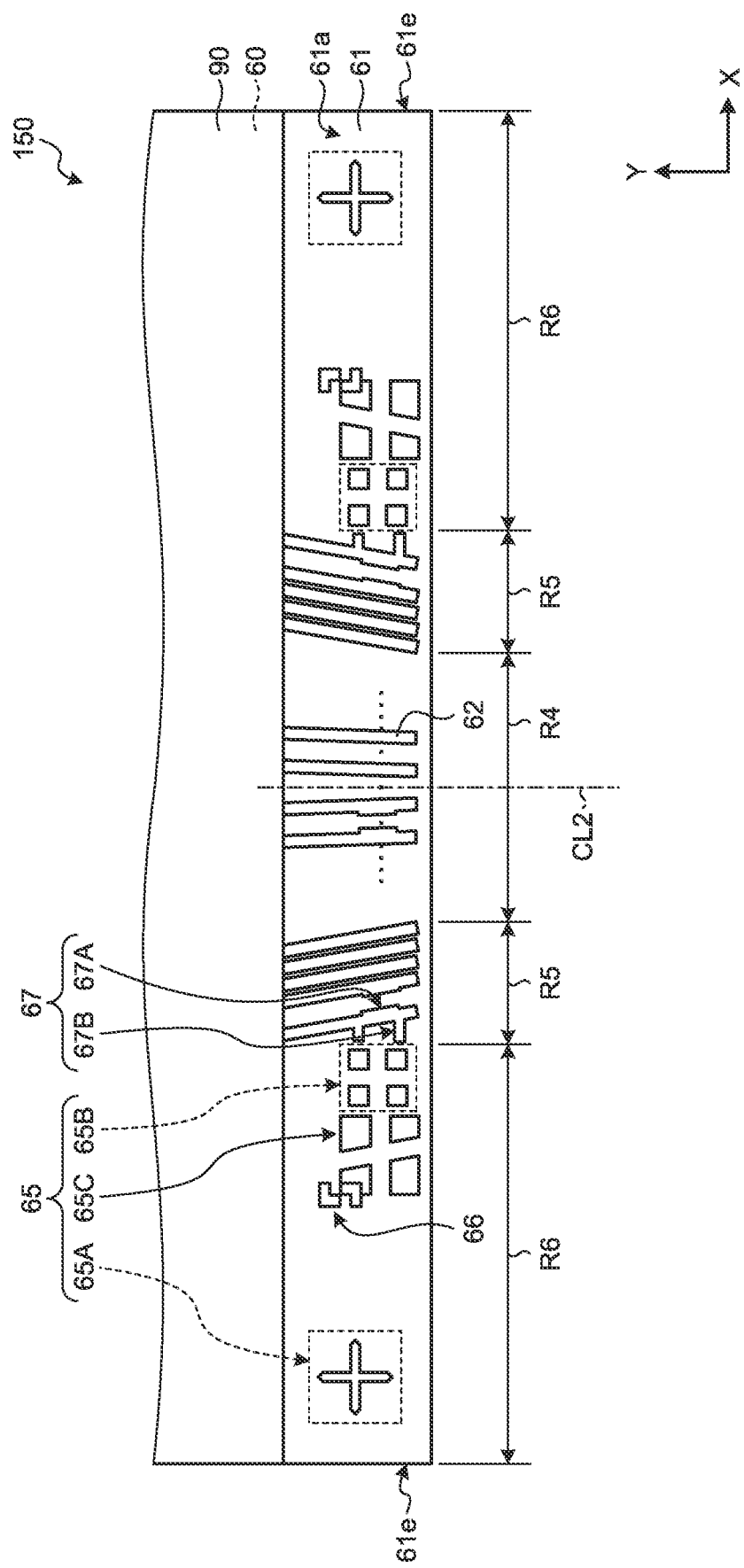
FIG. 5 is a plan view of an exemplary configuration of a display panel according to the embodiment.

The TFT substrate 60 has a projection 61 projecting to the outside of the counter substrate 90. A first surface 61a of the projection 61 is provided with a plurality of panel terminals 62 (refer to FIG. 4, which will be described later). The panel terminals 62 are directly or indirectly coupled to the lines provided in the display region. The panel terminals 62 are arrayed along the outer edge of the projection 61 to serve as a panel terminal group. As illustrated in FIG. 5, which will be described later, the first surface 61a of the projection 61 is provided with alignment marks 65, ACF check marks 66, and positional deviation check marks 67. The alignment marks 65, the ACF check marks 66, and the positional deviation check marks 67 will be described later.

As illustrated in FIGS. 1 and 2, the first wiring substrate 100 and the projection 61 are bonded in a film on glass (FOG) region R11. The periphery of the FOG region R11 is covered with the resin layer 95 applied to the surface 61a and the side surface of the projection 61. As a result, first FOG terminals 11 are sealed. The first wiring substrate 100 and the second wiring substrate 110 are bonded in a film on film (FOF) region R12.

As illustrated in FIG. 1, the second wiring substrate 110 is a flexible printed circuit (FPC) board. The second wiring substrate 110 is provided with a drive circuit 120 and a passive element 130, for example. The drive circuit 120 drives the touch panel (not illustrated). The second wiring substrate 110 is coupled to the touch panel. The second wiring substrate 110 is provided with a connector 117 for coupling the display device 200 to other devices.

The third wiring substrate 140 is an FPC board. The third wiring substrate 140 is coupled to the backlight. The third wiring substrate 140 and the second wiring substrate 110 are bonded in an FOF region R13 by soldering or using a connector, for example.

As illustrated in FIG. 3, the first wiring substrate 100 is obtained by: mounting an integrated circuit (IC) chip 5 on the surface of a long film-like base material (hereinafter, referred to as a film base material) 1 and die-cutting the film base material 1 with the IC chip 5 mounted on its surface along an outer cut line L1, for example. The first wiring substrate 100 is a chip on film (COF), for example. The first wiring substrate 100 includes the film base material 1, a plurality of first substrate terminals (hereinafter, referred to as first FOG terminals) 11, a plurality of second substrate terminals (hereinafter, referred to as first FOF terminals) 12, a plurality of alignment marks 13, 14, and 15, the IC chip 5, and a solder resist 7. The first FOG terminals 11 and the first FOF terminals 12 are provided on a first surface 1a of the film base material 1. The alignment marks 13, 14, and 15 are provided on the first surface 1a of the film base material 1. The IC chip 5 is mounted on the first surface 1a of the film base material 1. The solder resist 7 covers around the IC chip 5 on the first surface 1a of the film base material 1. The first FOG terminals 11 and the first FOF terminals 12 include a metal film, such as a copper (Cu) film, and plated with tin (Sn) on the surface of the metal film, for example.

The first FOG terminals 11 are bonded to the panel terminals 62 of the TFT substrate. The first FOG terminals 11 are arrayed along the outer cut line L1 (that is, the outer edge of the first wiring substrate 100) to serve as a FOG terminal group. The alignment marks 13 and 14 are provided on both sides of the FOG terminal group so as to sandwich the FOG terminal group in planar view. In bonding the first wiring substrate 100 to the TFT substrate 60, the alignment marks 13 and 14 are used for alignment thereof.

The first FOF terminals 12 are bonded to second FOF terminals 112 (refer to FIG. 14, which will be described later) of the second wiring substrate 110. The first FOF terminals 12 are arrayed along the outer cut line L1 (that is, the outer edge of the first wiring substrate 100) to serve as a first FOF terminal group. The alignment marks 15 are provided on both sides of the first FOF terminal group so as to sandwich the first FOF terminal group in planar view. In bonding the first wiring substrate 100 to the second wiring substrate 110, the alignment marks 15 are used for alignment thereof.

As illustrated in FIG. 4, the projection 61 of the TFT substrate 60 includes a glass substrate 71, a first insulating film 72, a first metal film 73, an interlayer insulating film 74, the panel terminal 62, a first translucent conductive film 75, a second insulating film 76, and a second translucent conductive film 77, for example. The glass substrate 71 serves as a first insulating substrate. The first insulating film 72 is provided on the glass substrate 71. The first metal film 73 is provided on the first insulating film 72. The interlayer insulating film 74 is provided on the first insulating film 72 and covers the first metal film 73. The panel terminal 62 serves as a second metal film provided on the interlayer insulating film 74. The first translucent conductive film 75 is provided on the interlayer insulating film 74 and covers around the panel terminal 62. The second insulating film 76 is provided on the interlayer insulating film 74 and covers around the panel terminal 62 and the first translucent conductive film 75. The second translucent conductive film 77 covers a center portion of and around the panel terminal 62. The center portion of the panel terminal 62 is exposed from the first translucent conductive film 75 and the second insulating film 76, and the exposed portion is covered with the second translucent conductive film 77. The center portion of the panel terminal 62 is in contact with the second translucent conductive film 77.

The first insulating substrate is not limited to a glass substrate and may be a flexible resin substrate. The first insulating film 72 is made of an inorganic film, such as a silicon oxide film and a silicon nitride film. The first insulating film 72, for example, has a multilayered structure in which a silicon oxide film and a silicon nitride film are stacked in this order from the glass substrate 71 side. The first metal film 73 is made of a material including molybdenum. The interlayer insulating film 74 is made of an inorganic film, such as a silicon oxide film and a silicon nitride film. The interlayer insulating film 74, for example, has a multilayered structure in which a silicon oxide film, a silicon nitride film, and a silicon oxide film are stacked in this order from the glass substrate 71 side.

The panel terminals 62 are provided in the same layer as that of signal lines (not illustrated) and sources and drains (not illustrated) of pixel transistors provided in the display region. The panel terminals 62 are made of the same material as that of the signal lines, the sources, and the drains. The panel terminals 62 and the signal lines and the sources and the drains of the pixel transistors provided in the display region, for example, are made of the second metal film including titanium and aluminum, for example. The panel terminals 62 and the signal lines and the sources and the drains of the pixel transistors provided in the display region have a multilayered structure in which titanium, aluminum, and titanium are stacked in this order from the film base material 1 side, for example. Scanning lines (not illustrated) provided in the display region are made of the same material as that of the first metal film.

The first translucent conductive film 75 is provided in the same layer as that of a common electrode (not illustrated) provided in the display region and made of the same material as that of the common electrode. The first translucent conductive film 75 is made of an indium tin oxide (hereinafter, referred to as ITO) film, for example.

The second insulating film 76 is provided in the same layer as that of a capacitance insulating film provided in the display region and made of the same material as that of the capacitance insulating film. The second insulating film 76 is made of an inorganic film, such as a silicon nitride film.

The second translucent conductive film 77 is provided in the same layer as that of pixel electrodes (not illustrated) provided in the display region and made of the same material as that of the pixel electrodes. The second translucent conductive film 77 is made of an ITO film, for example. Alternatively, the pixel electrodes may be provided in the same layer as that of the first translucent conductive film, and the common electrodes may be provided in the same layer as that of the second translucent conductive film.

As illustrated in FIG. 4, the panel terminal 62 the center portion of which is covered with the second translucent conductive film 77 is coupled to the first FOG terminal 11 of the first wiring substrate 100 via conductive particles 81 included in an anisotropic conductive film (hereinafter, referred to as an ACF) 80. The long side of the first FOG terminal 11 inclines with respect to the second direction (Y-axis direction).

As illustrated in FIG. 3, in the first wiring substrate 100, a first center line CL1 passes through the center of the array of the first FOG terminals 11 (FOG terminal group) in the X-axis direction and is parallel to the Y-axis direction. The first center line CL1 passes between the first FOG terminal 11 inclining to the right with respect to the Y-axis direction and the first FOG terminal 11 inclining to the left with respect to the Y-axis direction. In the first wiring substrate 100, a first region R1 includes the first center line CL1, second regions R2 are farther away from the first center line CL1 than the first region R1, and third regions R3 are farther away from the first center line CL1 than the second regions R2. The first FOG terminals 11 are disposed in the first region R1 and the second regions R2, for example. The alignment mark 13 is disposed in each third region R3.

The first FOG terminals 11 extend inclining with respect to the Y-axis direction. The inclination of the first FOG terminal 11 with respect to the Y-axis direction is greater at a position farther away from the first center line CL1 (that is, a position closer to an edge 1e of the film base material 1) than a position closer to the first center line CL1. The inclination of the first FOG terminal 11 with respect to the Y-axis direction is greater in the second regions R2 than in the first region R1, for example. When θ1 is the inclination of the first FOG terminal 11 with respect to the Y-axis direction in the first region R1, and θ2 is the inclination of the first FOG terminal 11 with respect to the Y-axis direction in the second regions R2, θ1<θ2 is satisfied. The inclination of the first FOG terminals 11 with respect to the Y-axis direction according to the present embodiment continuously increases closer to the edge 1e of the film base material 1 (that is, farther away from the first center line CL1).

FIG. 5 is a plan view of an exemplary configuration of the display panel according to the embodiment. As illustrated in FIG. 5, in the projection 61 of the TFT substrate 60, a second center line CL2 passes through the center of the array of the panel terminals 62 (panel terminal group) in the X-axis direction and is parallel to the Y-axis direction. In the projection 61 of the TFT substrate 60, a fourth region R4 includes the second center line CL2, fifth regions R5 are farther away from the second center line CL2 than the fourth region R4, and sixth regions R6 are farther away from the second center line CL2 than the fifth regions R5. The panel terminals 62 are provided in the fourth region R4 and the fifth regions R5, for example. The alignment marks 65 are disposed in the sixth regions R6.

Figure 6:
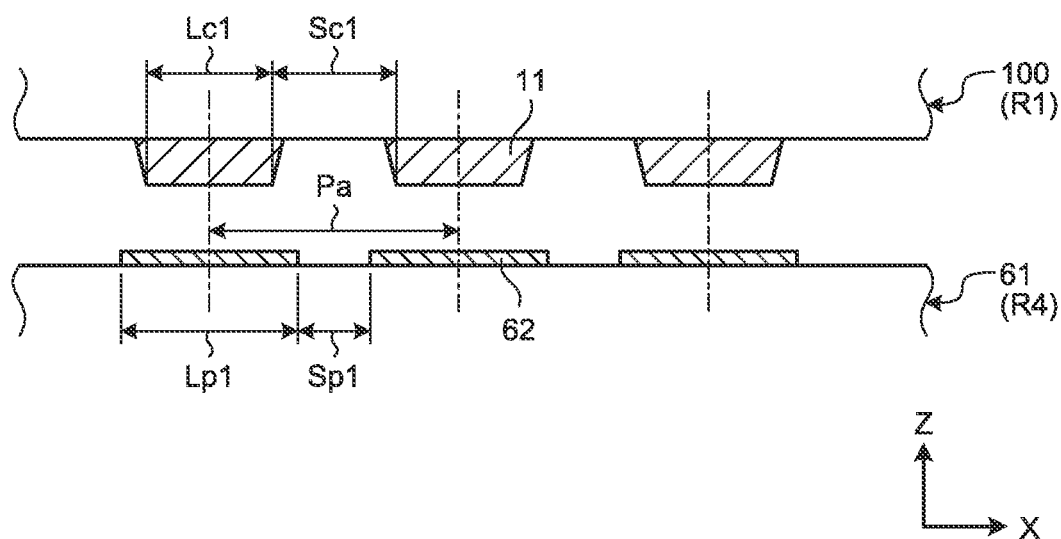
FIG. 6 is a sectional view of a first region of the first wiring substrate and a fourth region of the TFT substrate according to the embodiment.
Figure 7:
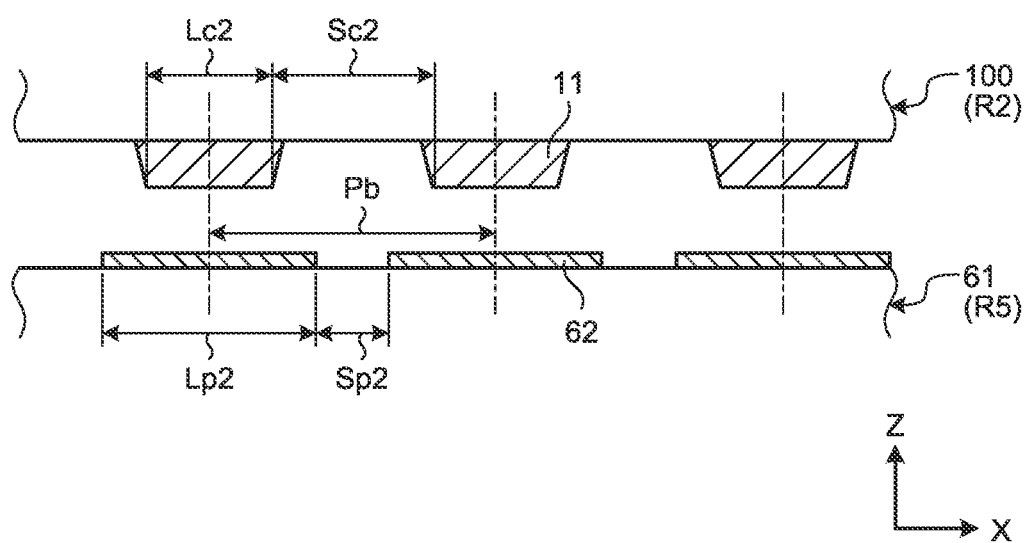
FIG. 7 is a sectional view of a second region of the first wiring substrate and a fifth region of the TFT substrate according to the embodiment.

FIG. 6 is a sectional view of the first region of the first wiring substrate and the fourth region of the TFT substrate according to the embodiment. FIG. 7 is a sectional view of the second region of the first wiring substrate and the fifth region of the TFT substrate according to the embodiment. As illustrated in FIG. 6, the first FOG terminals 11 positioned in the first region R1 of the first wiring substrate 100 are bonded to the respective panel terminals 62 positioned in the fourth region R4 of the TFT substrate 60. As illustrated in FIG. 7, the first FOG terminals 11 positioned in the second regions R2 of the first wiring substrate 100 are bonded to the respective panel terminals 62 positioned in the fifth regions R5 of the TFT substrate 60.

The pitch between the first FOG terminals 11 arranged in the X-axis direction is greater in the second regions R2 than in the first region R1. As illustrated in FIGS. 5 to 7, for example, when Pa is the pitch between the first FOG terminals 11 in the first region R1 (hereinafter, referred to as a center pitch or an inner pitch), and Pb is the pitch between the first FOG terminals 11 in the second regions R2 (hereinafter, referred to as an outer pitch), Pa<Pb is satisfied. The outer pitch Pb is 1.1 to 2 times the length of the center pitch Pa. The hitch between the first FOG terminals 11 according to the present embodiment continuously increases closer to the edge 1e of the film base material 1. In the present specification, the pitch indicates the gap between reference positions of the respective terminals adjacent to each other. The reference position is the center of each terminal in the width direction (e.g., the X-axis direction), for example.

The width of the first FOG terminal 11 in the first region R1 is equal to that in the second regions R2. As illustrated in FIGS. 6 and 7, for example, when Lc1 is the width of the first FOG terminal 11 in the first region R1, and Lc2 is the width of the first FOG terminal the second regions R2, Lc1=Lc2 is satisfied. The width of the first FOG terminal 11 according to the present embodiment is constant regardless of the distance from the center line CL1. In the present specification, being equal simply needs to be approximately equal, that is, substantially equal, and a slight difference generated in manufacturing can be allowed. Being constant simply needs to be approximately constant, that is, substantially constant, and a slight difference generated in manufacturing can be allowed.

The space between the first FOG terminals 11 arranged adjacent to each other in the X-axis direction is greater in the second regions R2 than in the first region R1. As illustrated in FIGS. 6 and 7, for example, when Sc1 is the space between the first FOG terminals 11 in the first region R1, and Sc2 is the space between the first FOG terminals 11 in the second regions R2, Sc1<Sc2 is satisfied. The space between the first FOG terminals 11 according to the present embodiment continuously increases closer to the edge 1e of the film base material 1.

The pitch between the panel terminals 62 arranged adjacent to each other in the X-axis direction is greater in the fifth regions R5 than in the fourth region R4. The pitch between the panel terminals 62 in the fourth region R4, for example, is equal to the inner pitch Pa of the first FOG terminals 11. The pitch between the panel terminals 62 in each fifth region R5 is equal to the outer pitch Pb of the first FOG terminals 11. The pitch between the panel terminals 62 according to the present embodiment continuously increases closer to an edge 61e (refer to FIG. 5) of the projection 61.

The space between the panel terminals 62 arranged adjacent to each other in the X-axis direction in the fourth region R4 is equal to that in the fifth regions R5. As illustrated in FIGS. 6 and 7, for example, when Sp1 is the space between the panel terminals 62 in the fourth region R4, and Sp2 is the space between the panel terminals 62 in the fifth regions R5, Sp1=Sp2 is satisfied. The space between the panel terminals 62 according to the present embodiment is constant regardless of the distance from the second center line CL2.

The width of the panel terminal 62 is greater in the fifth regions R5 than in the fourth region R4. When Lp1 is the width of the panel terminal 62 in the fourth region R4, and Lp2 is the width of the panel terminal 62 in the fifth regions R5, Lp1<Lp2 is satisfied. The width of the panel terminals 62 according to the present embodiment continuously increases closer to the edge 61e (refer to FIG. 5) of the projection 61 (that is, farther away from the second center line CL2).

The difference between the width of the first FOG terminal 11 in the first region R1 and the width of the panel terminal 62 in the fourth region R4 is expressed by Lp1−Lc1. The difference between the width of the first FOG terminal 11 in the second regions R2 and the width of the panel terminal 62 in the fifth regions R5 is expressed by Lp2−Lc2. Because Lp2>Lp1 and Lc2=Lc1 are satisfied, (Lp2−Lc2)>(Lp1−Lc1) is satisfied. In alignment of the first FOG terminals 11 with respect to the panel terminals 62, this structure can make a margin in each second region R2 greater than that in the first region R1.

As illustrated in FIG. 5, the first surface 61a of the projection 61 of the TFT substrate 60 is provided with the alignment marks 65 and the check marks 66 and 67. In bonding the TFT substrate 60 to the first wiring substrate 100, the alignment marks 65 are used for alignment thereof. The check marks 66 are used to check the position to which the ACF 80 is bonded. The check marks 67 are used to check a positional deviation between the panel terminals 62 of the TFT substrate 60 and the first FOG terminals 11 of the first wiring substrate 100.

The alignment marks 65 are provided on both sides (e.g., the sixth regions R6) of the panel terminal group including the panel terminals 62 so as to sandwich the panel terminal group in planar view. The alignment marks 65 and the check marks 66, for example, are provided in the sixth regions R6. The alignment marks 65 and the check marks 66 are disposed in line symmetry with respect to the second center line CL2 in planar view. The check marks 67 are provided in the fifth regions R5. The check marks 67, for example, are provided adjacent to the respective panel terminals 62. First marks 67A (which will be described later) of the check marks 67 may be provided also in the fourth region R4.

The alignment mark 65 includes alignment marks 65A, 65B, and 65C, for example. The alignment mark 65A is used to cause a manufacturing apparatus (not illustrated) to recognize a conveyed set position of the TFT substrate 60. The alignment mark 65A is an alignment mark used for an automatic mechanism in which the image of the alignment mark is automatically recognized by the manufacturing apparatus in alignment of the manufacturing apparatus and the conveyed set. The alignment mark 65B is an alignment mark used for an automatic mechanism in which the image of the alignment mark is automatically recognized by the manufacturing apparatus (not illustrated) when the manufacturing apparatus aligns the TFT substrate 60 and the first wiring substrate 100. The alignment mark 65C is an alignment mark used for a manual mechanism in which the image of the alignment mark is recognized by an operator when the operator aligns the TFT substrate 60 and the first wiring substrate 100 by a manual operation.

Figure 8:
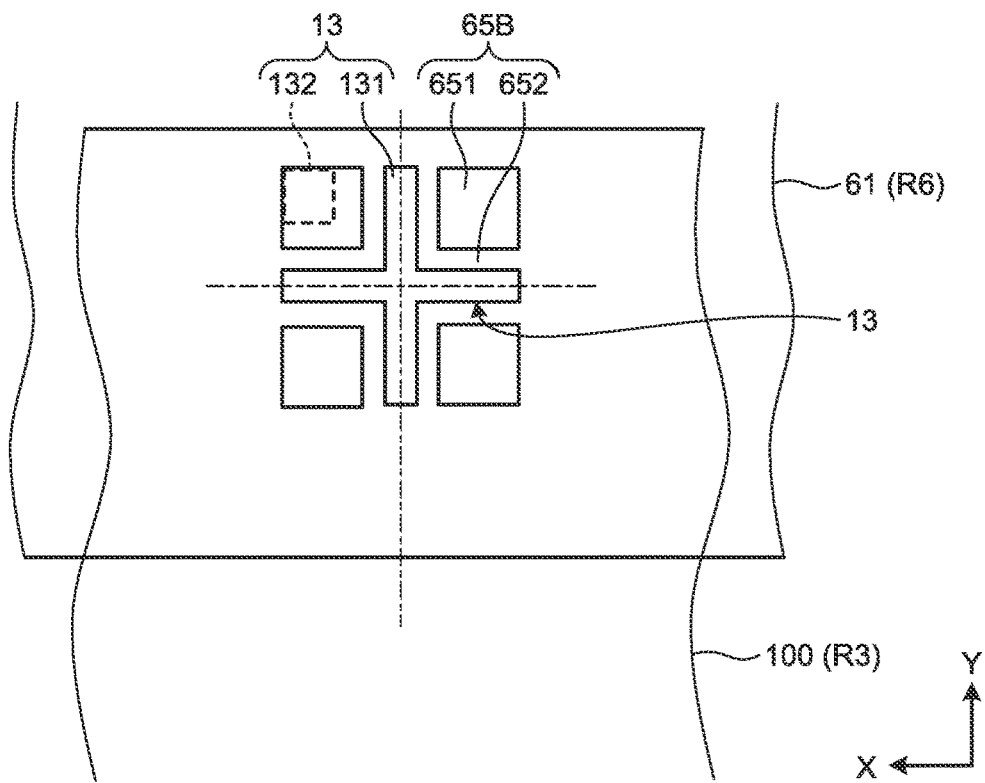
FIG. 8 is a plan view illustrating a state where the centers of alignment marks for as automatic mechanism coincide.

FIG. 8 is a plan view illustrating a state where the centers of the alignment marks for the automatic mechanism coincide. As illustrated in FIG. 8, the alignment mark 65B includes four metal films 651 and a light transmissive region 652. The shape in planar view (hereinafter, referred to as the planar shape) of the metal film 651 is a rectangle. The planar shape of the light transmissive region 652 is defined by the four metal films 651. The metal films 651 are made of the same kind of metal as that of the panel terminals 62. The metal films 651 are respectively disposed at four corners of a virtual region (not illustrated) having a rectangular planar shape. As a result, the planar shape of the light transmissive region 652 is a cross.

The alignment mark 13 includes a first metal film 131 and a second metal film 132. The first metal film 131 and the second metal film 132 are made of the same kind of metal as that of the first FOG terminals 11, for example. The planar shape of the first metal film 131 is a cross. The planar shape of the second metal film 132 is a rectangle.

FIG. 8 illustrates a case where the first metal film 131 overlaps the light transmissive region 652, and the second metal film 132 hides behind the metal film 651 when the first wiring substrate 100 is viewed from the TFT substrate 60 side. In this case, the center of the alignment mark 13 coincides with the center of the alignment mark 65B. When the center of the alignment mark 13 coincides with the center of the alignment mark 65B on both sides of the array of the first FCG terminals 11, the first wiring substrate 100 is aligned with the projection 61. When the panel terminals 62 are coupled to the first FOG terminals 11, the alignment marks 13 and 65B are in the state illustrated in FIG. 8.

The state where the first wiring substrate 100 is aligned with the projection 61 according to the present embodiment is not limited to the state illustrated in FIG. 8. The center of the alignment mark 13 may be shifted with respect to the center of the alignment mark 65B.

Figure 9:
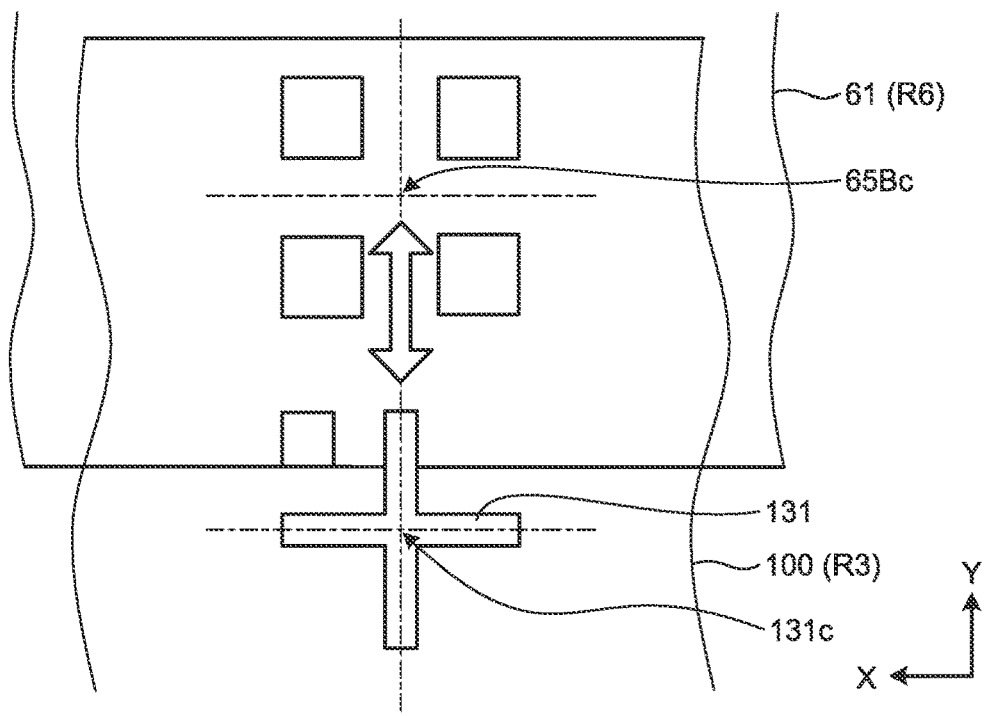
FIG. 9 is a plan view illustrating position shift of the alignment marks.

FIG. 9 is a plan view illustrating position shift of the alignment marks. As illustrated in FIG. 9, the first wiring substrate 100 may be aligned with the projection 61 when a center 65Bc of the alignment mark 65B and a center 131c of the first metal film 131 of the alignment mark 13 are aligned in the Y-axis direction, and the distance between the centers 65Bc and 131c is a predetermined value (shift value). In this case, when the panel terminals 62 are coupled to the first FOG terminals 11, the alignment marks 13 and 65B are in the state illustrated in FIG. 9.

Figure 10:
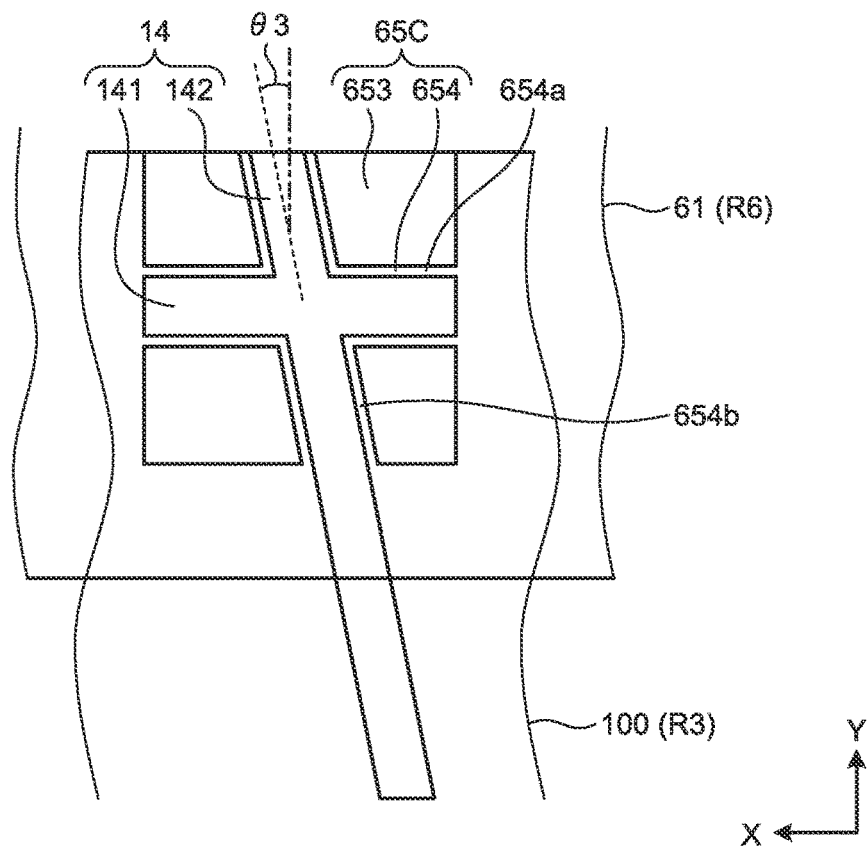
FIG. 10 is a plan view illustrating a state where the centers of alignment marks for a manual mechanism coincide.

FIG. 10 is a plan view illustrating a state where the centers of the alignment marks for the manual mechanism coincide. When the panel terminals 62 are coupled to the first FOG terminals 11, the alignment marks 14 and 65C are in the state illustrated in FIG. 10. As illustrated in FIG. 10, the alignment mark 65C includes four metal films 653 and a light transmissive region 654. The planar shape of the metal film 653 is a rectangle. The planar shape of the light transmissive region 654 is defined by the four metal films 653. The metal films 653 are made of the same kind of metal as that of the panel terminals 62. The metal films 653 are respectively disposed at four corners of a virtual region (not illustrated) having a rectangular planar shape. As a result, the planar shape of the light transmissive region 654 is a cross. The light transmissive region 654 has a linear part 654a and a linear part 654b intersecting the linear part 654a in planar view. The linear part 654a is parallel to the X-axis direction. The linear part 654b inclines with respect to the Y-axis direction. The inclination of the linear part 654b with respect to the Y-axis direction is an angle θ3. The angle θ3 is greater than the angles θ1 and θ2. In other words, θ1<θ2<θ3 is satisfied.

The planar shape of the alignment mark 14 is a cross. The alignment mark 14, for example, has a linear part 141 and a linear part 142 intersecting the linear part 141 in planar view. The linear part 141 is parallel to the X-axis direction. The linear part 142 inclines with respect to the Y-axis direction. The inclination of the linear part 142 with respect to the Y-axis direction is the angle θ3. The alignment mark 14 is made of a metal of the same type as that of the first FOG terminals 11.

FIG. 10 illustrates a case where the alignment mark 14 overlaps the light transmissive region 654 when the first wiring substrate 100 is viewed from the TFT substrate 60 side. In this case, the center of the alignment mark 14 coincides with the center of the alignment mark 65C. If the center of the alignment mark 14 coincides with the center of the alignment mark 65C on both sides of the terminal array of the first FOG terminals 11, the first wiring substrate 100 is aligned with the projection 61.

Figure 11:
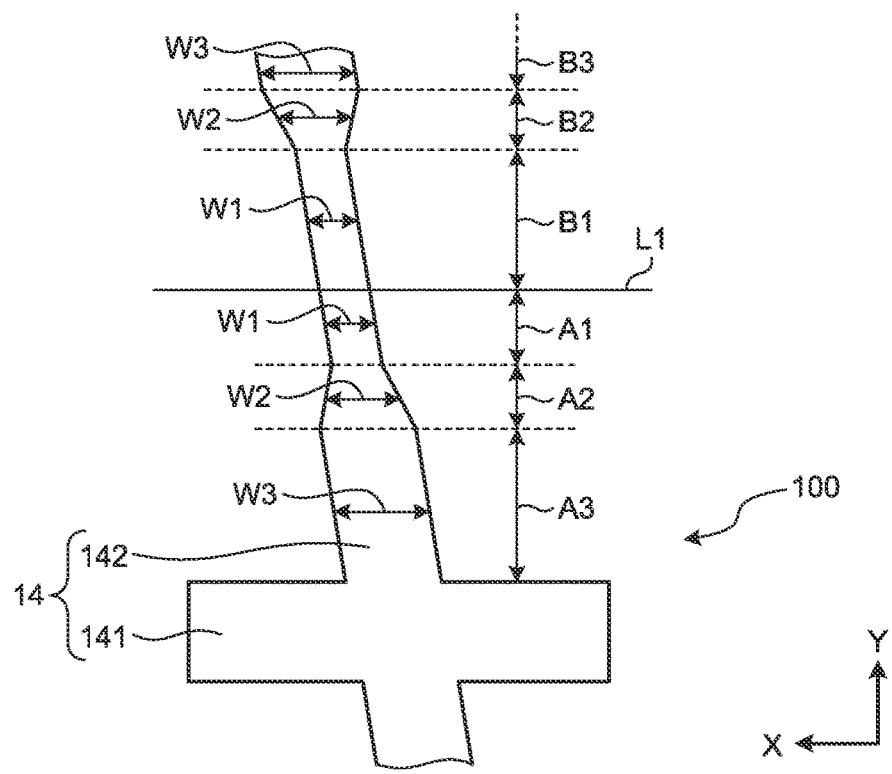
FIG. 11 is a diagram of as exemplary structure of a portion overlapping an outer cut line in planar view and a portion near the overlapping portion in the alignment mark for the manual mechanism.

FIG. 11 is a diagram of an exemplary structure of a portion overlapping the outer cut line L1 in planar view and a portion near the overlapping portion in the alignment mark for the manual mechanism. As illustrated in FIG. 11, in the alignment mark 14, the portion overlapping the outer cut line L1 in planar view and the portion near the overlapping portion have the width gradually varying depending on the distance from the outer cut line L1. The linear part 142 of the alignment mark 14, for example, overlaps the outer cut line L1 in planar view. The linear part 142 has a first portion A1, a second portion A2, and a third portion A3 positioned on the first wiring substrate 100 inside the outer cut line L1. The linear part 142 also has a first portion B1, a second portion B2, and a third portion B3 positioned on the first wiring substrate 100 outside the outer cut line L1.

The first portions A1 and B1 are closest to the outer cut line L1 and overlap the outer cut line L1 in planar view. The third portions A3 and B3 are farther away from the outer cut line L1. The second portion A2 is positioned between the first portion A1 and the third portion A3, and the second portion B2 is positioned between the first portion B1 and the third portion B3. When W1 is the width of the first portions A1 and B1, W2 is the width of the second portions A2 and B2, and W3 is the width of the third portions A3 and B3, W1<W2<W3 is satisfied. The width W2 is greater than the width W1, and the width W3 is greater than the width W2. Consequently, the manufacturing apparatus can determine whether the film base material 1 is accurately die-cut along the outer cut line L1 by measuring the width of the portion of the linear part 142 positioned at the end of the first wiring substrate 100.

Figure 12:
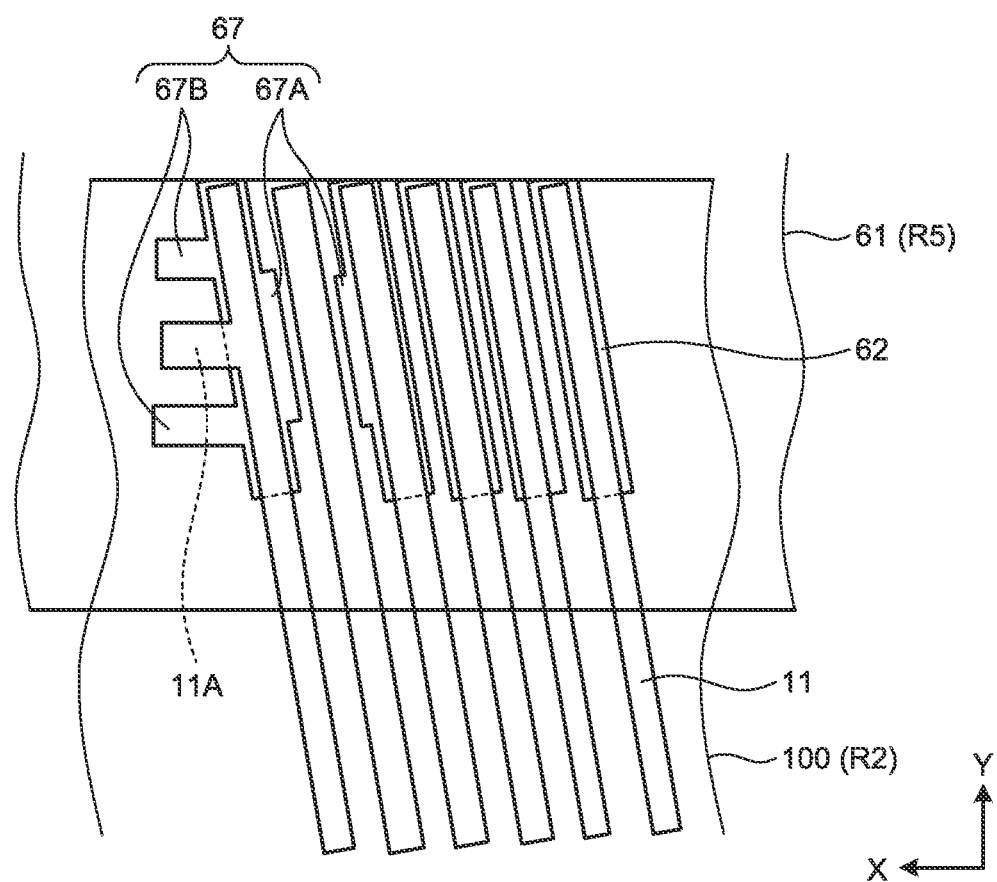
FIG. 12 is a plan view of an exemplary structure of a positional deviation check mark.

FIG. 12 is a plan view of an exemplary structure of the positional deviation check mark. As illustrated in FIG. 12, the positional deviation check mark 67 includes first marks 67A and second marks 67B to check positional deviation of the first FOG terminals 11 with respect to the panel terminals 62. The first marks 67A are used to check positional deviation in the X-axis direction, and the second marks 67B are used to check positional deviation in the Y-axis direction.

The first marks 67A, for example, are respectively provided to a pair of panel terminals 62 arranged adjacent to each other in the X-axis direction. One of the first marks 67A is provided on a side of one panel terminal 62 of the adjacent panel terminals 62, the side facing the other panel terminal 62. The other of the first marks 67A is provided on a side of the other panel terminal 62, the side facing the one panel terminal 62. In the present embodiment, when the first wiring substrate 100 is properly aligned with the projection 61, the first FOG terminal 11 is disposed between the pair of first marks 67A, and spaces are secured between the first marks 67A and the first FOG terminal 11 as illustrated in FIG. 12. Consequently, the manufacturing apparatus can determine whether the positional deviation in the X-axis direction falls within an allowable range by appearance inspection of the positional relation between the first marks 67A and the first FOG terminal 11.

The second marks 67B are provided on a first side of one panel terminal 62. A pair of second marks 67B, for example, is provided on the first side of the panel terminal 62. The second marks 67B are disposed away from each other. The first FOG terminal 11 facing, in the Z-axis direction, the panel terminal 62 having the second marks 67B has a protrusion 11A protruding in the X-axis direction from a side of the first FOG terminal 11. In the present embodiment, when the first wiring substrate 100 is properly aligned with the projection 61, the protrusion 11A is disposed between the pair of second marks 67B, and spaces are secured between the second marks 67B and the protrusion 11A, as illustrated in FIG. 12. Consequently, the manufacturing apparatus can determine whether the positional deviation in the Y-axis direction falls within an allowable range by appearance inspection of the positional relation between the second marks 67B and the protrusion 11A.

Mounting the first wiring substrate 100 on the display panel 150 is performed as follows. The manufacturing apparatus automatically recognizes the alignment marks 13 and 65B for the automatic mechanism, automatically aligns the display panel 150 with the first wiring substrate 100, and bonds the first FOG terminals 11 to the panel terminals 62 by applying heat and pressure. To check the quality after compression bonding, the manufacturing apparatus automatically recognizes the positional deviation check marks 67 and checks whether positional deviation is present. Based on the check results, the manufacturing apparatus determines the quality of the product.

When the automatic mechanism is not available, or when a product having an inferior compression boding quality is repaired, the operator aligns the display panel 150 with the first wiring substrate 100 by a manual operation. The operator, for example, visually recognizes the alignment marks 14 and 65C for the manual mechanism and aligns the display panel 150 with the first wiring substrate 100 such that the centers of the alignment marks 14 and 65C overlap with each other in planar view. The operator views the positional deviation check marks 67 and checks whether positional deviation is present. Consequently, even if it is difficult to perform automatic alignment by the manufacturing apparatus, the operator can align the display panel 150 with the first wiring substrate 100 by a manual operation.

As described above, the first wiring substrate 100 according to the embodiment includes a film-like base material (e.g., the film base material 1) and a plurality of first substrate terminals (e.g., the first FOG terminals 11) provided on the first surface 1a of the film base material 1. The first FOG terminals 11 are arranged in the X-axis direction.

A first terminal included in the first FOG terminals 11 is positioned closer to the edge 1e (FIG. 3) of the film base material 1 in the X-axis direction than a second terminal included in the first FOG terminals 11. The first terminal corresponds to one terminal included in the first FOG terminals 11 and positioned in the second region R2 (refer to FIGS. 3 and 7), for example. The second terminal corresponds to one terminal included in the first FOG terminals 11 and positioned in the first region R1 (refer to FIGS. 3 and 6). The inclination with respect to the Y-axis direction is greater in the first terminal than in the second terminal. A first pitch (e.g., the pitch Pb) between the first terminal and a third terminal disposed adjacent to the first terminal in the X-axis direction is greater than a second pitch (e.g., the pitch Pa) between the second terminal and a fourth terminal disposed adjacent to the second terminal in the X-axis direction.

This structure can make a margin in alignment of the first FOG terminals 11 with the panel terminals 62 greater. When the first wiring substrate 100 is relatively moved with respect to the display panel 150 in the Y-axis direction in mounting the first wiring substrate 100 on the display panel 150, for example, the first FOG terminals 11 are moved with respect to the panel terminals 62. This allows the positions of the first FOG terminals 11 with respect to the panel terminals 62 to be corrected. The inclination with respect to the Y-axis direction is greater in the first terminal farther away from the first center line CL than in the second terminal closer to the first center line CL1. With this structure, the first terminal has a greater margin in alignment than the second terminal.

When the manufacturing apparatus bonds (e.g., bonds by applying heat and pressure) terminals on a wiring substrate to terminals on a display panel, heat is applied to the wiring substrate. As a result, the wiring substrate expands with heat, whereby dimensional variation may possibly occur in the width of the terminals on the wiring substrate and spaces between the terminals thereon, for example. If the wiring substrate is a film substrate, and the display panel is a glass panel, dimensional variation also occurs between the wiring substrate and the display panel because of the difference in the coefficient of thermal expansion. The dimensional variation tends to increase closer to the edge of the wiring substrate. The dimensional variation leads to mounting deviation of the wiring substrate with respect to the display panel and may possibly cause mounting failure. As the display panel is designed to have higher resolution, the width of the terminals on the wiring substrate and the spaces between the terminals tend to be finer. As a result, the margin in alignment of the wiring substrate with the display panel is reduced, thereby increasing the difficulty in mounting.

By contrast, the display device and the wiring substrate of the present embodiment allow the margin in the alignment of the first FOG terminals 11 with the panel terminals 62 to be greater. Particularly at the edge 1e of the film base material 1, the margin in the alignment of the first FOG terminals 11 is greater. Thus, if dimensional variation occurs in the width of the first FOG terminals 11 and the spaces between the first FOG terminals 11, for example, the influence of the dimensional variation can be accommodated by relatively moving the first wiring substrate 100 with respect to the display panel 150 in the Y-axis direction. Consequently, the first wiring substrate 100 is less likely to cause mounting deviation with respect to the display panel 150.

The first wiring substrate 100 is also less likely to cause mounting deviation with respect to display panels having higher resolution and can improve the quality of mounting.

The first wiring substrate 100 is also less likely to cause mounting deviation with respect to other wiring substrates having higher resolution.

In the present embodiment, the width Lc2 of the first terminal is equal to the width Lc1 of the second terminal. The pitch (e.g., the pitches Pa and Pb) between the first FOG terminals 11 continuously increases closer to the edge 1e of the film base material 1 in the X-axis direction.

The inclination (e.g., the angles θ1 and θ2) of the first FOG terminals 11 with respect to the Y-axis direction continuously increases closer to the edge 1e of the film base material 1 in the X-axis direction.

The first wiring substrate 100 includes the alignment marks (e.g., the alignment mark 14) provided on the first surface 1a of the film base material 1. The alignment mark 14 is positioned closer to the edge 1e of the film base material 1 in the X-axis direction than the first FOG terminals 11. The alignment mark 14 has the linear part 142 having the inclination with respect to the Y-axis direction greater than that of the first FOG terminals 11.

The first wiring substrate 100 includes a plurality of second substrate terminals (e.g., the first FOF terminals 12) provided on the first surface 1a of the film base material 1. The first FOF terminals 12 and the first FOG terminals 11 are placed on opposite sides of the region provided with the element (e.g., the IC chip 5) on the film base material 1.

The first wiring substrate 100 includes the IC chip 5 mounted on the first surface 1a of the film base material 1. The first FOG terminals 11 and the first FOF terminals 12 are coupled to the IC chip 5.

The display device 200 according to the embodiment includes the first wiring substrate 100 and the display panel 150 to which the first wiring substrate 100 is attached. The display panel 150 includes a plurality of panel terminals 62 coupled to a plurality of first FOG terminals 11. The long side of the panel terminal 62 inclines with respect to the second direction. The panel terminals 62 include a fifth terminal that is the panel terminal 62 coupled to the first terminal, and a sixth terminal that is the panel terminal 62 coupled to the second terminal. The fifth terminal corresponds to one terminal included in the panel terminals 62 and positioned in the fifth region R5 (refer to FIGS. 5 and 7), for example. The sixth terminal corresponds to one terminal included in the panel terminals 62 and positioned in the fourth region R4 (refer to FIGS. 5 and 6). The width Lp2 of the fifth terminal is greater than the width Lp1 of the sixth terminal.

A space (gap) between the fifth terminal and a seventh terminal disposed adjacent to the fifth terminal in the X-axis direction of the panel terminals 62 is defined as a third gap (e.g., the space Sp2). A space (gap) between the sixth terminal and an eighth terminal disposed adjacent to the sixth terminal in the X-axis direction of the panel terminals 62 is defined as a fourth gap (e.g., the space Sp1). The spaces Sp1 and Sp2 are equal in width.

The aspect of the display device 200 according to the embodiment may also be described as follows. The display device 200 includes the display panel 150 and the wiring substrate (e.g., the first wiring substrate 100). The display panel 150 includes a plurality of panel terminals 62 arranged in the first direction (e.g., the X-axis direction). The wiring substrate includes a plurality of first substrate terminals (e.g., the first FOG terminals 11) arranged in the X-axis direction and coupled to the panel terminals 62. The panel terminals 62 have a first region (e.g., the fourth region R4) and second regions (e.g., the fifth regions R5) sandwiching the first region. The first FOG terminals 11 have a third region (e.g., the first region R1) and fourth regions (e.g., the second regions R2) sandwiching the third region. In the fourth region R4 and each fifth region R5, the gap between adjacent panel terminals 62 of the panel terminals 62 is substantially constant. The panel terminals 62 have a first width (e.g., the width Lp1) in the fourth region R4 and have a second width (e.g., the width Lp2) different from the first width in each fifth region R5. In the first region R1 and each second region R2, the width of the first FOG terminals 11 is substantially constant. The first FOG terminals 11 have a first gap (e.g., the space Sc1) between two first FOG terminals 11 disposed adjacent to each other in the first region R1 and have a second gap (e.g., the space Sc2) different from the first gap between two first FOG terminals 11 disposed adjacent to each other in each second region R2.

The width Lp2 is greater than the width Lp1, and the space Sc2 is greater than the space Sc1.

The first wiring substrate 100 is provided with the IC chip 5 that drives the display panel 150. The first FOG terminals 11 in the first region R1 and the second regions R2 are coupled to the IC chip 5.

In the fifth regions R5, the panel terminals 62 each have an inclination with respect to the second direction, that is, an inclination diagonally intersecting the X-axis direction in planar view (e.g., an inclination along a direction diagonally intersecting both of the X-axis direction and the Y-axis direction in planar view). In the second regions R2, the first FOG terminals 11 each have an inclination with respect to the second direction. The panel terminals 62 may incline with respect to the second direction also in the fourth region R4. As illustrated in FIG. 5, the inclination of the panel terminals 62 with respect to the second direction increases from the center position (second center line CL2) of the display panel 150 in the first direction to the edge of the display panel 150 and with distance from the center position (second center line CL2) in the first direction.

One of two alignment marks 65B sandwiching the panel terminals 62 in the X-axis direction is an example of a first alignment mark, and the other thereof is an example of a second alignment mark. One of two alignment marks 65C sandwiching the first alignment mark and the second alignment mark in the X-axis direction is an example of a third alignment mark, and the other thereof is an example of a fourth alignment mark.

One of two alignment marks 13 sandwiching the first FOG terminals 11 the X-axis direction is an example of a fifth alignment mark, and the other thereof is an example of a sixth alignment mark. One of two alignment marks 14 sandwiching the fifth alignment mark and the sixth alignment mark in the X-axis direction is an example of a seventh alignment mark, and the other thereof is an example of an eighth alignment mark.

Modifications

As illustrated in FIG. 3, the first FOF terminals 12 of the first wiring substrate 100 according to the above embodiment above extend from the inside of the first wiring substrate 100 to the outside thereof beyond the outer cut line L1. The aspect of the first wiring substrate according to the present embodiment is not limited thereto.

Figure 13:
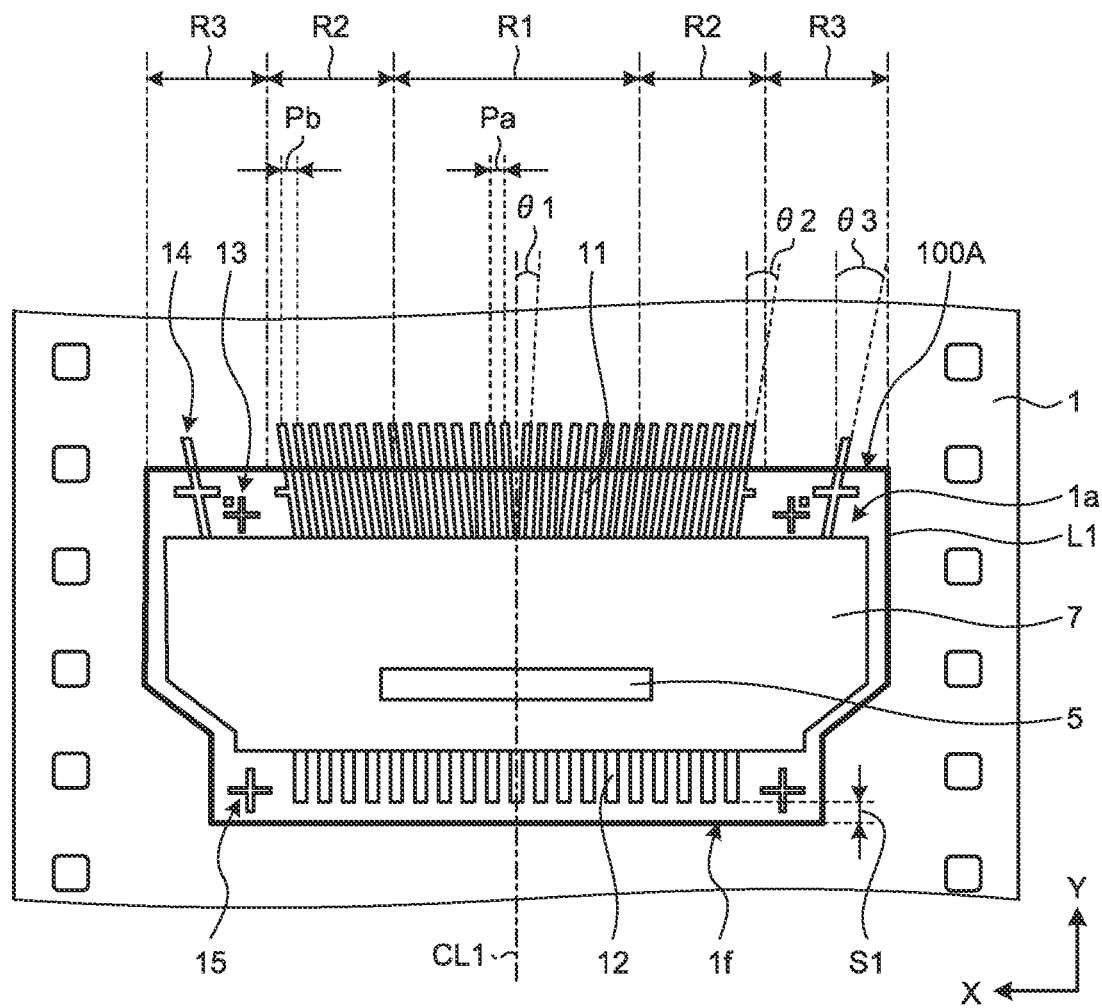
FIG. 13 is a plan view of the first wiring substrate according to a modification of the embodiment.

FIG. 13 is a plan view of the first wiring substrate according to a modification of the embodiment. As illustrated in FIG. 13, in a first wiring substrate 100A according to the modification of the embodiment, the first FOF terminals 12 do not extend beyond the outer cut line L1. The first FOF terminals 12 are positioned on the first wiring substrate 100A inside the outer cut line L1. The ends of the first FOF terminals 12 are separated from an edge 1f of the film base material 1 in the Y-axis direction. In other words, a space S1 is formed between the ends of the first FOF terminals 12 and the edge 1f of the film base material 1 in the Y-axis direction. Also with this structure, the first FOF terminals 12 of the first wiring substrate 100A can be bonded to the respective terminals of the second wiring substrate 110 in the FOF region R12 (refer to FIGS. 1 and 2).

Figure 14:
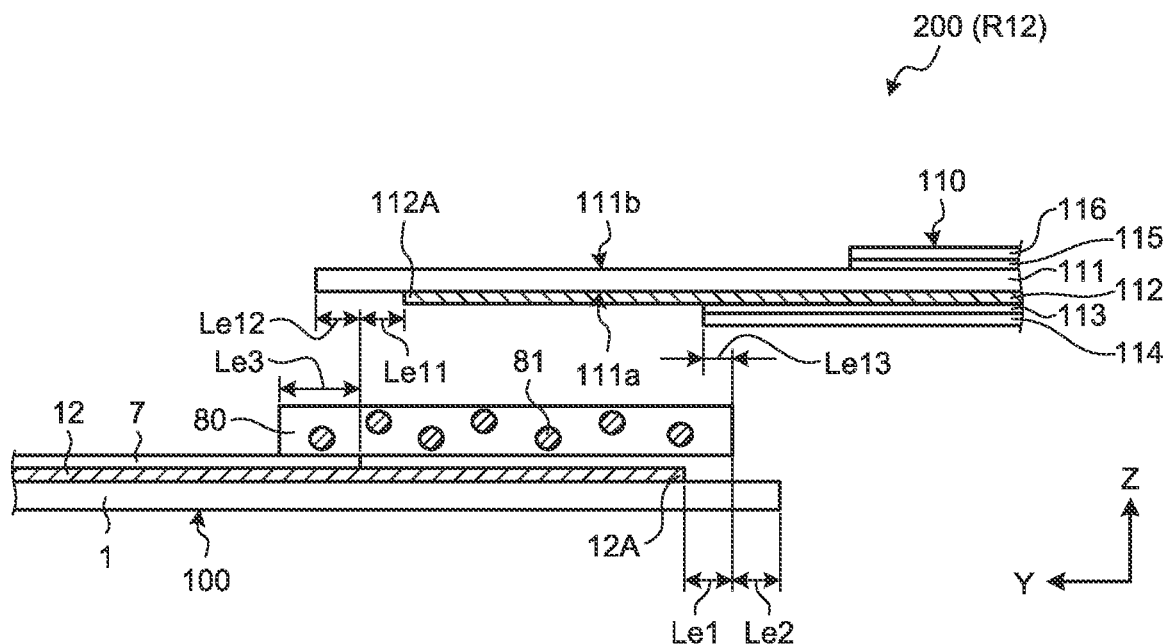
FIG. 14 is a sectional view illustrating a state of the first wiring substrate and a second wiring substrate before being bonded.
Figure 15:
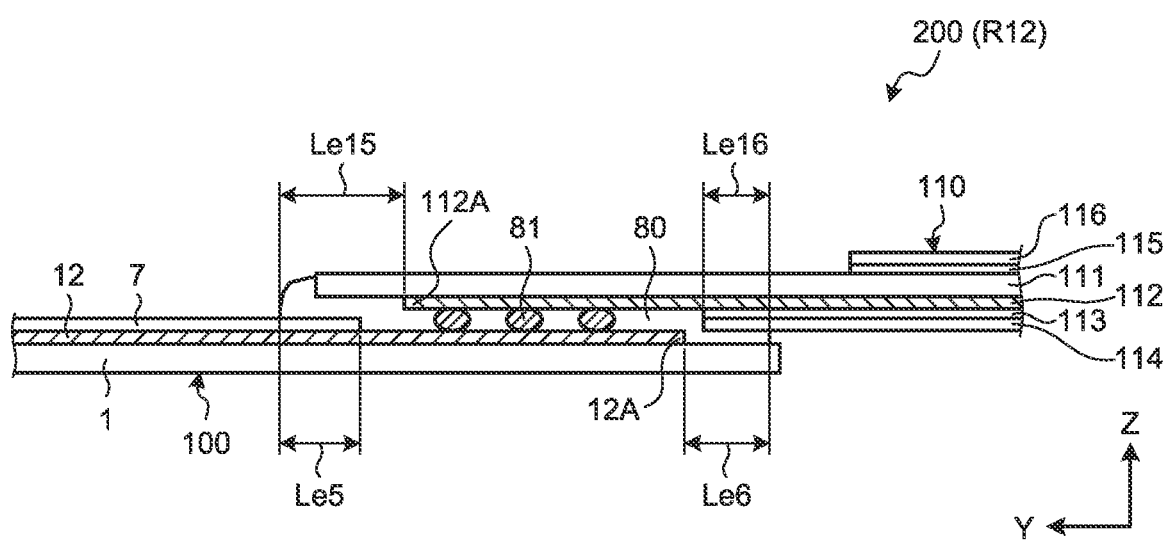
FIG. 15 is a sectional view illustrating a state of the first wiring substrate and the second wiring substrate after being bonded.

FIG. 14 is a sectional view illustrating a state of the first wiring substrate and the second wiring substrate before being bonded. FIG. 15 is a sectional view illustrating a state of the first wiring substrate and the second wiring substrate after being bonded. As illustrated in FIGS. 14 and 15, the second wiring substrate 110 includes a film base material 111, second FOF terminals 132, adhesive layers 113 and 115, and cover films 114 and 116. The second FOF terminals 112, the adhesive layer 113, and the cover film 114 are provided on a first surface 111a of the film base material 111. The cover film 114 is bonded to the film base material 113 with the adhesive layer 113 interposed therebetween. The adhesive layer 115 and the cover film 116 are provided on a second surface 111b of the film base material 311. The cover film 116 is bonded to the film base material 111 with the adhesive layer 115 interposed therebetween.

The first FOF terminals 12 of the first wiring substrate 100 are coupled to the second FOF terminals 112 of the second wiring substrate 110 via the ACF 80 interposed therebetween. As illustrated in FIG. 14, in the state where the first wiring substrate 100 and the second wiring substrate 110 are yet to be bonded. Le1 is the distance between an end 12A of the first FOF terminal 12 and an end of the ACF 80 in the Y-axis direction, Le2 is the distance between the end of the ACF 80 and an end of the film base material 1 in the Y-axis direction, and Le3 is the length in the Y-axis direction of a part in which the solder resist 7 and the ACF 80 overlap with each other. The distance Le1 is 0.2 to 0.7 mm, the distance Le2 is 0.2 to 0.7 mm, and the length Le3 is 0.2 to 0.7 mm.

In the state where the first wiring substrate 100 and the second wiring substrate 110 are yet to be bonded, Le11 is the distance between an end of the solder resist 7 and an end 112A of the second FOF terminal 112 in the Y-axis direction, Le12 is the length in the Y-axis direction of a part in which the solder resist 7 and the film base material 111 overlap with each other, and Le13 is the length in the Y-axis direction of a part in which the ACF 80 and the cover film 114 overlap with each other. The distance Le11 is 0 to 0.5 mm, the distance Le12 is 0 to 0.5 mm, and the length Le13 is 0.2 to 0.7 mm. The end 112A of the second FOF terminal 112 according to the present embodiment is preferably positioned in the inner region of the film base material 111 to prevent corrosion. The distance between the end of the film base material 111 and the end 112A of the second FOF terminal 112 (Le11+Le12) is preferably greater than 0 mm.

As illustrated in FIG. 15, in the state where the first wiring substrate 100 and the second wiring substrate 110 are bonded, Le5 is the length in the Y-axis direction of a part in which the solder resist 7 and the ACF 80 overlap with each other, and Le6 is the distance between the end 12A of the first FOF terminal 12 and the end of the ACF 80 in the Y-axis direction. The length Le5 is 0.2 to 0.9 mm, and the distance Le6 is 0.2 to 1.4 mm. In the state where the first wiring substrate 100 and the second wiring substrate 110 are bonded, Le15 is the distance between the end 112A of the second FOF terminal 112 and the end of the ACF 80 in the Y-axis direction, and Le16 is the length in the Y-axis direction of a part in which the cover film 114 and the ACF 80 overlap with each other. The distance Le15 is 0.2 to 1.4 mm, and the length Le16 is 0.2 to 1.4 mm.

As described above, when the first wiring substrate 100 and the second wiring substrate 110 are bonded, the ends 12A of the first FOF terminals 12 and the ends 112A of the second FOF terminals 112 are covered with the ACF 80. The ends 12A and 112A are sealed with the ACF 80 and are not exposed to the air. As a result, the first FOF terminals 12 and the second FOF terminals 112 are prevented from being corroded by water condensation, for example.

While exemplary embodiments according to the present invention have been described, the embodiments are not intended to limit the invention. For example, the first FOF terminals 12 and the second FOF terminals 112 each may have an inclination with respect to the second direction (e.g., the Y-axis direction) as in the case of the first FOG terminals 11 and the panel terminals 62. The contents disclosed in the embodiments are given as an example only, and various changes may be made without departing from the spirit of the present invention. Appropriate changes made without departing from the spirit of the present invention naturally fall within the technical scope of the invention.

What is claimed is:

1. A thin film transistor (TFT) substrate configured to be connected to a wiring substrate, the TFT substrate comprising:
   first terminals arranged in a first direction; and
   a first mark, wherein
   a terminal area is an area where the first terminals are formed,
   the wiring substrate is configured to be connected to the first terminals and the first mark,
   each of the first terminals includes an inclination with respect to a second direction intersecting the first direction,
   the inclination of the first terminals increases from a center position of the terminal area in the first direction to an edge of the TFT substrate and with distance from the center position in the first direction,
   the first mark is located between the edge of the TFT substrate and the terminal area,
   the first mark includes a pair of second terminals,
   the second terminals are separated from each other,
   each of the second terminals includes a convex portion,
   the convex portions of the second terminals are separated from each other,
   in the first direction, the convex portions of the second terminals face each other in an area between the pair of the second terminals, and
   each of the second terminals includes an inclination with respect to the second direction.

2. The TFT substrate configured to be connected to the wiring substrate of claim 1, wherein
   the wiring substrate includes a third terminal, a fourth terminal, a fifth terminal, and sixth terminals, and
   when the wiring substrate is connected to the TFT substrate,
      each of sixth terminals is connected to the respective first terminal,
      the third terminal is connected to one of the pair of second terminals,
      the fourth terminal is connected to the other of the pair of second terminals,
      the fifth terminal overlaps a gap between the pair of the convex portions, and
      the fifth terminal is not connected to the first mark.

3. The TFT substrate configured to be connected to the wiring substrate of claim 2, the TFT substrate further comprising a second mark between the edge of the TFT substrate and the first mark, wherein
the second mark includes four metal films,
the four metal films are separated from each other,
a shape of a light transmissive region of the second mark, which is defined by the four metal films, is a cross shape,
a first portion of the light transmissive region of the cross shape is parallel to the first direction, and
a second portion of the light transmissive region of the cross shape is parallel to the second direction.

4. The TFT substrate configured to be connected to the wiring substrate of claim 3, the TFT substrate further comprising a third mark between the edge of the TFT substrate and the second mark, wherein
the third mark includes four metal films,
the four metal films of the third mark are separated from each other,
a shape of a light transmissive region of the third mark, which is defined by the four metal films of the third mark, is a cross shape,
a first portion of the light transmissive region of the cross shape of the third mark is parallel to the first direction, and
a second portion of the light transmissive region of the cross shape of the third mark includes an inclination with respect to the second direction.

5. The TFT substrate configured to be connected to the wiring substrate of claim 4, the TFT substrate further comprising a fourth mark between the edge of the TFT substrate and the third mark, wherein
the fourth mark includes a cross shaped metal film,
a first line of the cross shaped metal film is parallel to the first direction, and
a second line of the cross shaped metal film is parallel to the second direction.

6. The TFT substrate configured to be connected to the wiring substrate of claim 5, wherein
the third mark is located between the second mark and the fourth mark in the first direction, and
the second mark is located between the first mark and the third mark in the first direction.

7. The TFT substrate configured to be connected to the wiring substrate of claim 2, wherein
a gap between adjacent first terminals in the first direction is substantially constant in the terminal area, and
a gap between the pair of the convex portions in the first direction is larger than the gap between adjacent first terminals.

8. The TFT substrate configured to be connected to the wiring substrate of claim 7, wherein a first width of a first terminal of the first terminals nearer the center of the terminal area is different from a second width of a first terminal of the first terminals nearer the first mark.

9. The TFT substrate configured to be connected to the wiring substrate of claim 8, wherein the second width is greater than the first width.

* * * * *